US010574919B2

(12) United States Patent
Kim

(10) Patent No.: US 10,574,919 B2
(45) Date of Patent: Feb. 25, 2020

(54) HIGH-SPEED AND LOW-POWER ANALOG-TO-DIGITAL CONVERTER AND CMOS IMAGE SENSOR USING THE SAME

(71) Applicant: SK hynix Inc., Gyeonggi-do (KR)

(72) Inventor: Hyeon-June Kim, Jeollanam-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/005,060

(22) Filed: Jun. 11, 2018

(65) Prior Publication Data

US 2019/0098245 A1    Mar. 28, 2019

(30) Foreign Application Priority Data

Sep. 28, 2017    (KR) .......................... 10-2017-0126243

(51) Int. Cl.
| | |
|---|---|
| H04N 5/376 | (2011.01) |
| H04N 5/3745 | (2011.01) |
| H04N 5/378 | (2011.01) |
| H03M 1/56 | (2006.01) |
| H03M 1/12 | (2006.01) |
| H03M 1/38 | (2006.01) |

(52) U.S. Cl.
CPC ............ *H04N 5/3765* (2013.01); *H03M 1/56* (2013.01); *H04N 5/378* (2013.01); *H04N 5/37455* (2013.01); *H03M 1/123* (2013.01); *H03M 1/38* (2013.01)

(58) Field of Classification Search
None
See application file for complete search history.

(56) References Cited

U.S. PATENT DOCUMENTS

| | | | | |
|---|---|---|---|---|
| 9,070,608 | B2* | 6/2015 | Kim | ...................... H01L 27/146 |
| 9,276,597 | B1* | 3/2016 | Chang | ................. H03M 1/1023 |
| 2009/0201187 | A1* | 8/2009 | Asayama | ............ H03M 1/0863 |
| | | | | 341/145 |
| 2015/0042859 | A1* | 2/2015 | Lee | ...................... H04N 5/3575 |
| | | | | 348/311 |
| 2016/0006957 | A1* | 1/2016 | Park | ...................... H04N 5/378 |
| | | | | 348/308 |

(Continued)

FOREIGN PATENT DOCUMENTS

| | | |
|---|---|---|
| KR | 1020170124668 | 11/2017 |
| KR | 1020180031842 | 3/2018 |

*Primary Examiner* — Quan Pham
(74) *Attorney, Agent, or Firm* — IP & T Group LLP

(57) ABSTRACT

An ADC includes: a ramp signal selector suitable for selecting a ramp signal selector suitable for selecting a rising half ramp signal or falling half ramp signal according to a ramping direction detection result from a ramping direction detector; a comparator suitable for outputting an initial comparison result signal by initially comparing a half ramp signal and a pixel signal, and outputting a comparison result signal by comparing the rising or falling half ramp signal selected through the ramp signal selector to the pixel signal; the ramping direction detector suitable for detecting a ramping direction according to the initial comparison result signal from the comparator; and a data converter suitable for deciding an initial bit according to the initial comparison result signal from the comparator, and performing data conversion according to the comparison result signal from the comparator.

16 Claims, 9 Drawing Sheets

(56) References Cited

U.S. PATENT DOCUMENTS

| | | | |
|---|---|---|---|
| 2016/0165166 A1* | 6/2016 | Koh | H04N 5/3575 |
| | | | 348/302 |
| 2018/0198999 A1* | 7/2018 | Yoo | H04N 5/378 |
| 2019/0068906 A1* | 2/2019 | Kobayashi | H04N 5/378 |

* cited by examiner

HIGH-SPEED AND LOW-POWER ANALOG-TO-DIGITAL CONVERTER AND CMOS IMAGE SENSOR USING THE SAME

CROSS-REFERENCE TO RELATED APPLICATION

This application claims priority under 35 U.S.C. § 119 to Korean Patent Application No. 10-2017-0126243 filed on Sep. 28, 2017, which is incorporated herein by reference in its entirety.

BACKGROUND

1. Field

Exemplary embodiments relate generally to a complementary metal oxide semiconductor (CMOS) image sensor (CIS) and, more particularly, to an analog-to-digital converter (ADC) capable of reducing power consumption while analog-to-digital converting data at high speed, and a CIS using the same.

2. Discussion of the Related Art

Since a CIS implemented through the CMOS process has lower power consumption, a lower price and a smaller size than competing technologies (for example, a solid-state imaging device), the CIS has rapidly expanded the markets. Also, since the image quality of the CIS, which originally had been lower than the image quality of competing products, has been improved substantially, the application range of the CIS has been gradually expanded to include the video field which requires a high resolution and high frame rate.

The CIS requires an operation of converting an analog signal (pixel signal) outputted from a pixel array into a digital signal, unlike a solid-state imaging device. For such an operation of converting an analog signal into a digital signal, the CIS uses a high-resolution analog-to-digital converter (ADC) therein.

A CIS may use a method employing a single ADC or a column ADC.

The method using a single ADC converts analog signals outputted from pixel arrays of all columns into digital signals within a predetermined time, using one ADC operating at high speed. The method using a single ADC can reduce the chip area of the CIS, but has high power consumption because the ADC must operate at high speed.

In the method using a column ADC, however, an ADC with a simple structure (for example, a single-slope ADC) is arranged at each column. This method increases the chip area of the CIS, but has relatively low power consumption because each ADC may operate at low speed.

The method using a column ADC performs correlated double sampling (CDS) on an analog output voltage which is an output signal of the pixel array, and stores the result voltage. Furthermore, the method using a column ADC compares the voltage stored during the CDS to a predetermined ramp signal in response to a ramp signal generated through a ramp signal generator, and provides a result of the comparison for generating a digital code.

in this case, it is important to improve the characteristics of the ADC such that the CIS operates at high speed while implementing an image at high resolution.

However, the conventional ADC (for example, single-slope ADC) must increase an operation clock frequency of a counter by a multiple of 2, in order to improve the resolution one bit by one bit. Therefore, the conventional ADC cannot be implemented at high resolution while keeping the operation clock frequency of the counter fixed or reducing it. Furthermore, since the conventional ADC requires much time to convert analog data into digital data, the conventional ADC cannot operate at high speed and the power consumption thereof inevitably increases.

SUMMARY

Various embodiments are directed to an ADC which decides one bit in advance through an initial comparison process between a half ramp signal and a pixel signal, selects a rising or falling half ramp signal, compares the selected signal to the pixel signal, and performs analog-to-digital conversion according to the comparison result, and a CIS using the same.

In an embodiment, an ADC may include: a ramp signal selector suitable for selecting a rising half ramp signal or falling half ramp signal according to a ramping direction detection result from a ramping direction detector; a comparator suitable for outputting an initial comparison result signal by initially comparing a half ramp signal and a pixel signal, and outputting a comparison result signal by comparing the rising or falling half ramp signal selected through the ramp signal selector to the pixel signal; the ramping direction detector suitable for detecting a ramping direction according to the initial comparison result signal from the comparator; and a data converter suitable for deciding an initial bit according to the initial comparison result signal from the comparator, and performing data conversion according to the comparison result signal from the comparator. The comparator may include an initial comparator, and the initial comparator may include a swap block installed at an output terminal thereof, and suitable for adjusting a swing direction of the outputted comparison result signal according to the ramping direction detection result from the ramping direction detector. The ramp signal selector may include: a first switch suitable for turning on or off the rising half ramp signal applied to the comparator according to the ramping direction detection result from the ramping direction detector; and a second switch suitable for turning on or off the falling half ramp signal applied to the comparator according to the ramping direction detection result from the ramping direction detector. The ADC may further include a ramp signal generator suitable for generating the rising and falling half ramp signals. The ramp signal generator may include: a rising half ramp signal generator suitable for generating the rising half ramp signal; and a falling half ramp signal generator suitable for generating the falling half ramp signal. The ramp signal generator may further include a ramp signal offset controller suitable for controlling offsets of the rising and falling half ramp signals generated through the rising and falling half ramp signal generators. The ramp signal generator adjusts offset sizes of the rising and falling half ramp signals by controlling an on/off order of unit current cells according to a control signal from an image signal processor (ISP). The ramp signal generator may further include: a first buffer suitable for buffering the rising half ramp signal generated through the rising half ramp signal generator; and a second buffer suitable for buffering the falling half ramp signal generated through the falling half ramp signal generator. The rising half ramp signal generator generates the rising half ramp signal that swings to a half value of the entire ramping code from a common voltage value, and upward ramps after a ramp signal offset value is reflected. The falling half ramp signal generator generates the falling half ramp signal that swings to a half value of the entire ramping code from a common voltage value, and downward ramps after a ramp signal offset value is reflected.

In an embodiment, a CIS may include: a pixel array suitable for outputting a pixel signal corresponding to incident light; a row decoder suitable for selecting and controlling a pixel in the pixel array at each row line; a ramp signal generator suitable for generating rising and falling half ramp signals; a ramp signal selector suitable for selecting the rising or downward ramp signal from the ramp signal generator according to a ramping direction detection result from a ramping direction detector; a comparator suitable for outputting an initial comparison result signal by initially comparing a half ramp signal and the pixel signal, and outputting a comparison result signal by comparing the rising or falling half ramp signal selected through the ramp signal selector to the pixel signal; the ramping direction detector suitable for detecting a ramping direction according to the initial comparison result signal from the comparator; a data converter suitable for deciding an initial bit according to the initial comparison result signal from the comparator, and performing data conversion according to the comparison result signal from the comparator; a controller suitable for controlling the operations of the row decoder, the ramp signal generator, the comparator, the data converter and a column readout circuit; and the column readout circuit suitable for outputting data of a memory unit according to control of the controller. The comparator may include an initial comparator, and the initial comparator may include a swap block installed at an output terminal thereof, and suitable for adjusting a swing direction of the outputted comparison result signal according to the ramping direction detection result from the ramping direction detector. The ramp signal selector may include: a first switch suitable for turning on or off the rising half ramp signal applied to the comparison block according to the ramping direction detection result from the ramping direction detector; and a second switch suitable for turning on or off the falling half ramp signal applied to the comparison block according to the ramping direction detection result from the ramping direction detector. The ramp signal generator may further include: a rising half ramp signal generator suitable for generating the rising half ramp signal; and a falling half ramp signal generator suitable for generating the falling half ramp signal. The ramp signal generator may further include a ramp signal offset controller suitable for controlling offsets of the rising and falling half ramp signals generated through the rising and falling half ramp signal generators. The ramp signal generator adjusts offset sizes of the rising and falling half ramp signals by controlling an on/off order of unit current cells according to a control signal from an ISP. The ramp signal generator may further include: a first buffer suitable for buffering the rising half ramp signal generated through the rising half ramp signal generator; and a second buffer suitable for buffering the falling half ramp signal generated through the falling half ramp signal generator. The rising half ramp signal generator generates the rising half ramp signal that swings to a half value of the entire ramping code from a common voltage value, and upward ramps after a ramp signal offset value is reflected. The falling half ramp signal generator generates the falling half ramp signal that swings to a half value of the entire ramping code from a common voltage value, and downward ramps after a ramp signal offset value is reflected.

In an embodiment, a CIS may include: a ramp signal selector suitable for selecting one of rising and falling half ramp signals according to a ramping direction; a comparator suitable for first comparing a reference half ramp signal and a pixel signal, and secondly comparing the selected half ramp signal to the pixel signal; a ramping direction detector suitable for detecting the ramping direction according to the first comparison; and a data converter suitable for performing data conversion according to the second comparison.

These and other features and advantages of the present invention will become apparent to those with ordinary skill in the art to which the present invention belongs from the following description in conjunction with the accompanying drawings.

DETAILED DESCRIPTION

Figure 1A:
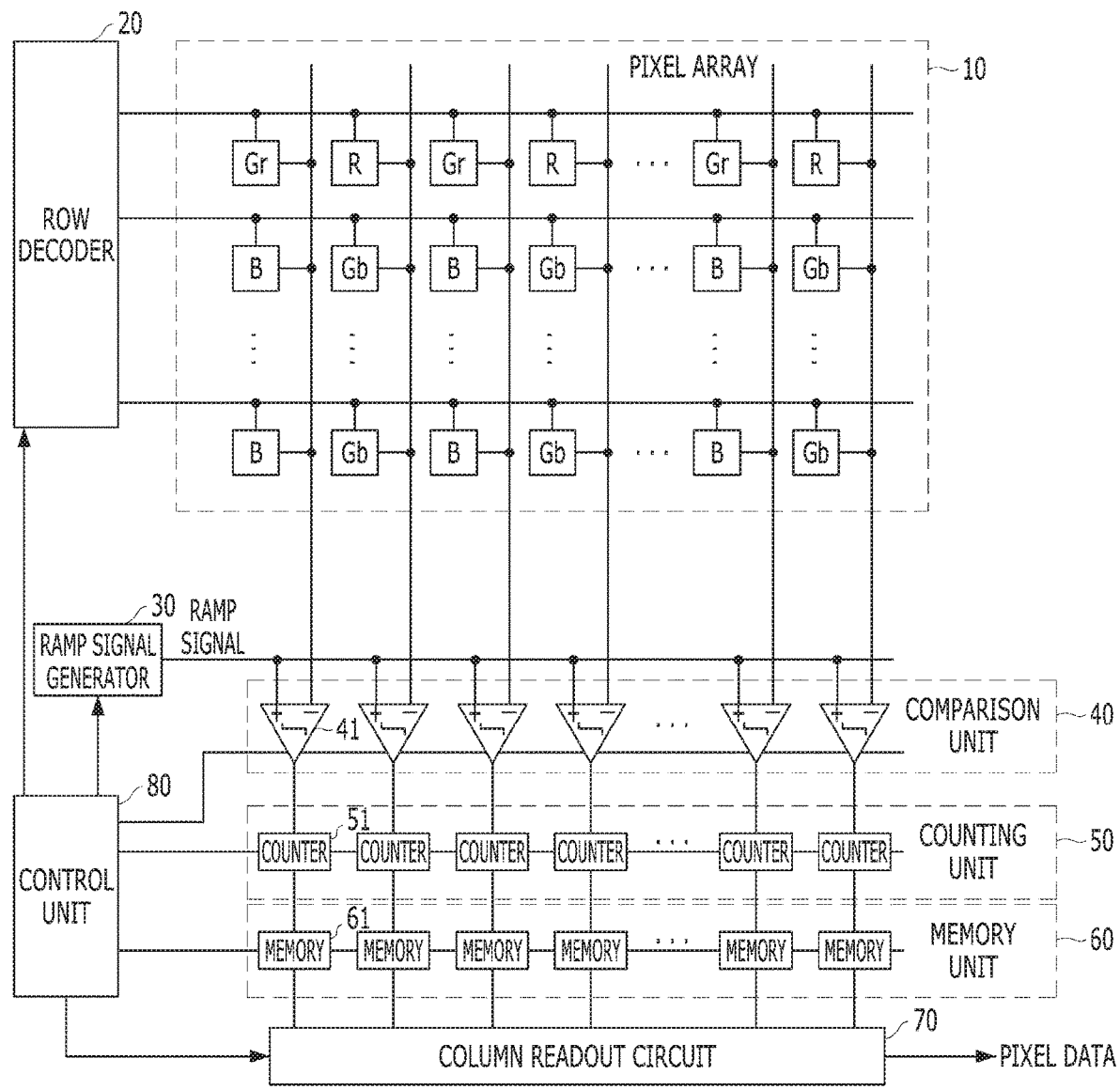
FIG. 1A is a configuration diagram of a CIS for promoting understandings of an embodiment.

Various embodiments will be described below in more detail with reference to the accompanying drawings for explaining the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being "connected to" or "coupled to" another element, it may indicate that the former element is directly connected or coupled to the latter element or another element is interposed therebetween. Furthermore, when an element "includes" or has a component, it may indicate that the element does not exclude another component unless referred to the contrary, but can further include another component.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes" and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1B:
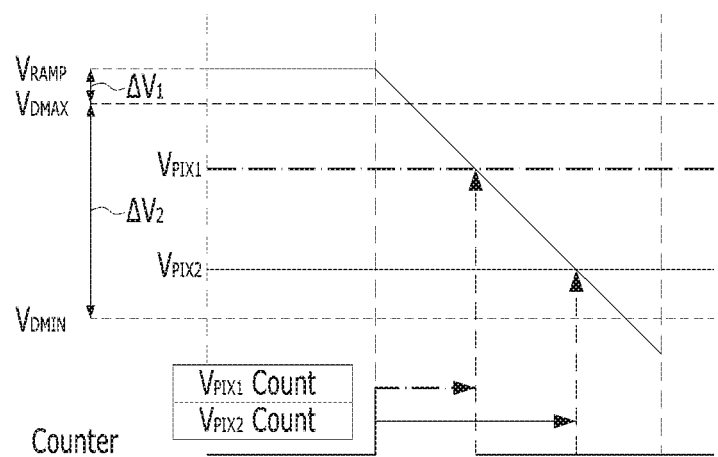
FIG. 1B is an analog-to-digital conversion timing diagram of the CIS illustrated in FIG. 1A.

FIG. 1A is a configuration diagram of a column parallel CIS which is implemented with a general single-slope analog-to-digital converter (ADC). FIG. 1B is an analog-to-digital conversion timing diagram of the CIS illustrated in FIG. 1A.

As illustrated in FIG. 1A, the CIS may include a pixel array 10, a row decoder 20, a ramp signal generator 30, a comparison unit 40, a counting unit 50, a memory unit 60, a control unit 80 and a column readout circuit 70.

The pixel array 10 may output a pixel signal corresponding to incident light.

The row decoder 20 may select a pixel in the pixel array 10 at each row line according to control of the control unit 80, and control an operation of the selected pixel.

The ramp signal generator 30 may generate a ramp signal according to control of the control unit 80.

The comparison unit 40 may compare the value of the ramp signal applied from the ramp signal generator 30 to the values of pixel signals outputted from the pixel array 10, according to control of the control unit 80.

The counting unit 50 may count a clock applied from the control unit 80 according to each of output signals of the comparison unit 40.

The memory unit 60 may store the counting information provided from the counting unit 50 according to control of the control unit 80.

The column readout circuit 70 may sequentially output data of the memory unit 60 as pixel data PXDATA according to control of the control unit 80.

The control unit 80 may control the operations of the row decoder 20, the ramp signal generator 30, the comparison unit 40, the counting unit 50, the memory unit 60 and the column readout circuit 70.

In this case, the CIS can compare pixel signals (pixel output voltages) before and after an optical signal is incident, and measure only an actual pixel signal generated through incident light, in order to remove an offset value of each pixel. Such an operation is referred to as correlated double sampling (CDS). The CDS may be performed by the comparison unit 40.

The comparison unit 40 may include a plurality of comparators, the counting unit 50 may include a plurality of counters, and the memory unit 60 may include a plurality of memories. That is, the comparators, the counters and the memories may be installed at the respective columns.

Referring now to FIGS. 1A and 1B, operations of one comparator, one counter and one memory will be described as follows.

First, the first comparator 41 may receive a pixel signal outputted from the first column of the pixel array 10 through one terminal thereof, receive a ramp signal $V_{RAMP}$ applied from the ramp signal generator 30 through the other terminal thereof, compare the values of the two signals according to a control signal from the control unit 80, and output a comparison result signal.

Since the ramp signal $V_{RAMP}$ has a voltage level that constantly increases or decreases as the time elapses after initialization was started, the values of the two signals inputted to the respective terminals of the comparator may coincide with each other at a certain point of time. After the point of time that the values of the two signals coincide with each other, the comparison result signal outputted from the comparator 41 may be inverted.

Therefore, the first counter 51 may count a clock provided from the control unit 80 from a point of time that the ramp signal starts to fall to the point of time that the comparison result signal outputted from the comparator 41 is inverted, and output the counting information. The counter 51 may be reset according to a reset control signal from the control unit 80.

Then, the first memory 61 may store the counting information from the counter 51 according to a load control signal from the control unit 80 and output the counting information to the column readout circuit 70.

In the above-described analog-to-digital conversion method, a maximum time required for analog-to-digital converting data may be decided by the data value. Such a data conversion time $T_{TOTAL}$ may be calculated through Equation 1 below.

$$T_{TOTAL}=(\Delta V_1+\Delta V_2)/\Delta V_{step}$$

$$\Delta V_1=V_{RAMP}-V_{DMAX}$$

$$\Delta V_2=V_{DMAX}-V_{DMIN}, \qquad \text{[Equation 1]}$$

In Equation 1, ΔVstep represents a decrement step when the ramp signal falls. Furthermore, $V_{DMAX}$ represents the maximum total amount of data converted during analog-to-digital conversion, and $V_{DMIN}$ represents the minimum total amount of data converted during analog-to-digital conversion.

However, the above-described ADC must increase the operation clock frequency of the counter by a multiple of 2 in order to improve the resolution one bit by one bit. Therefore, the ADC cannot implement a high resolution while keeping the operation clock frequency of the counter fixed or reducing it. In addition, since the ADC requires much time to convert analog data into digital data, the ADC cannot be operated at high speed and the power consumption thereof inevitably increases.

In accordance with an embodiment of the present invention an ADC is provided which may decide one bit (initial bit) in advance through an initial comparison process between a half ramp signal and a pixel signal, select a rising or falling half ramp signal, compare the selected half ramp signal to the pixel signal, and perform analog-to-digital conversion according to the comparison result, thereby reducing power consumption while analog-to-digital converting data at high speed. Exemplary configurations of the ADC of the present invention will be described in detail with reference to FIGS. 2A to 5.

Figure 2A:
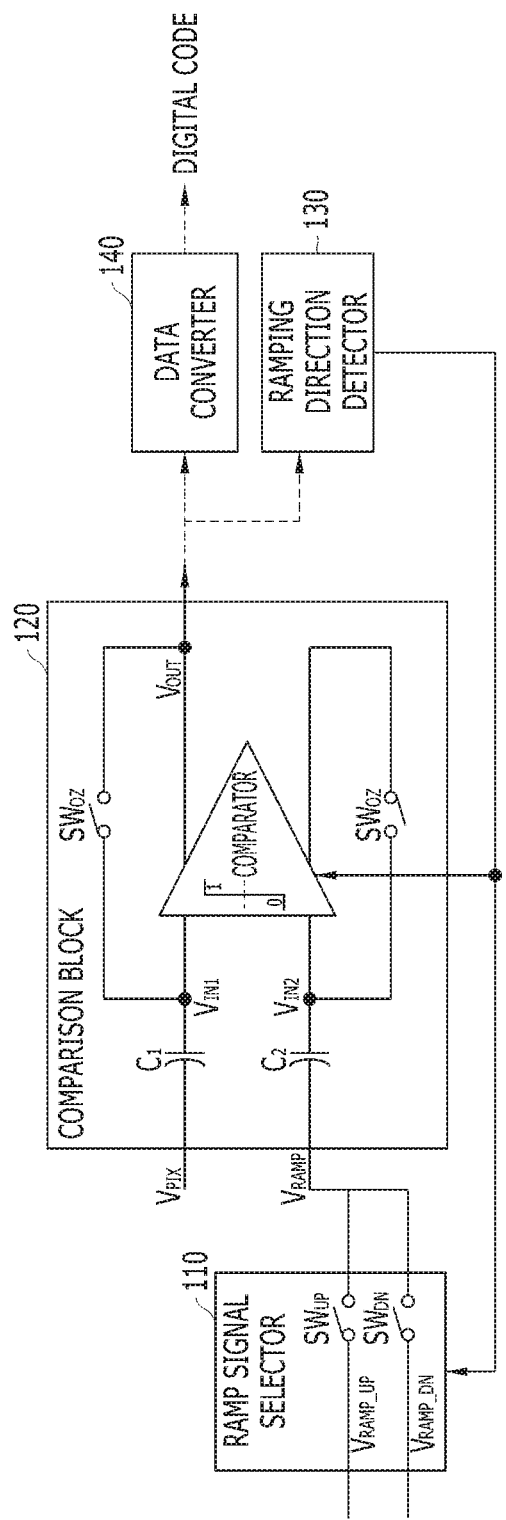
FIG. 2A is an exemplary configuration diagram of an analog-to-digital converter (ADC) in accordance with an embodiment of the present invention.
Figure 2B:
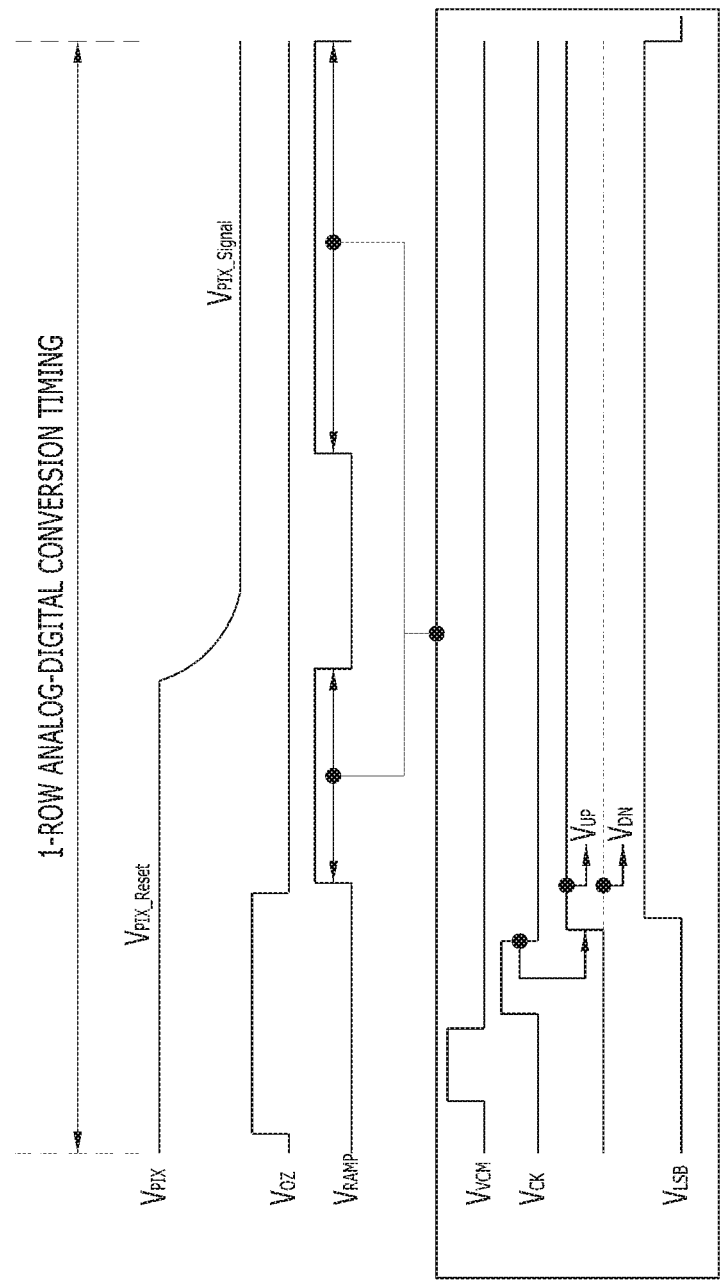
FIG. 2B is a timing diagram illustrating a 1-row analog-to-digital conversion period of the ADC illustrated in FIG. 2A.

FIG. 2A is an exemplary configuration diagram of an ADC in accordance with an embodiment of the present invention, and FIG. 2B is a timing diagram illustrating a 1-row analog-to-digital conversion period of the ADC illustrated in FIG. 2A.

As illustrated in FIG. 2A, the ADC in accordance with an embodiment of the present invention may include a ramp signal selector 110, a comparison block 120, a ramping direction detector 130 and a data converter 140.

The ramp signal selector 110 may select a rising half ramp signal $V_{RAMP\_UP}$ or falling half ramp signal $V_{RAMP\_DN}$ according to a ramping direction detection result received from the ramping direction detector 130.

The comparison block 120 may output an initial comparison result signal by initially comparing the half ramp signal and a pixel signal, and output a comparison result signal by comparing the rising or falling half ramp signal selected through the ramp signal selector 110 to the pixel signal. The half ramp signal includes the rising and falling half ramp signal. The initial comparison signal may be generated by comparing the pixel signal with the rising or falling half ramp signal which has a constant voltage level before ramping. The comparison signal may be generated by comparing the pixel signal with the rising or falling half ramp signal that ramp.

The ramping direction detector 130 may detect a ramping direction according to the initial comparison result signal from the comparison block 120. The ramping direction detector 130 may detect that the ramping direction is up or down whether a voltage level of the rising or falling half ramp signal having a constant voltage level is greater than a voltage level of the pixel signal or not.

The data converter 140 may decide an initial bit according to the initial comparison result signal from the comparison block 120, and then perform data conversion according to the comparison result signal from the comparison block 120.

A ramp signal generator, which will be described below with reference to FIGS. 3A to 3C, may generate the ramp signal selector 110 with a rising half ramp signal and a falling half ramp signal at the same time.

The ramp signal selector 110 may selectively transfer the rising and falling half ramp signals to the comparison block 120. The ramp signal selector 110 may include switches $SW_{UP}$ and $SW_{DN}$. The switch $SW_{UP}$ may switch on or off the rising half ramp signal applied to the comparison block 120 from the ramp signal generator according to the ramping direction detection result from the ramping direction detector 130. Also, the switch $SW_{DN}$ may switch on or off the falling half ramp signal applied to the comparison block 120 from the ramp signal generator according to the ramping direction detection result from the ramping direction detector 130.

In this case, the switches illustrated in FIG. 2A may be may be switched on or off according to the ramping direction detection result based on a control signal from a control unit (for example, a timing generator) or the initial comparison result signal from the comparison block 120, as illustrated in FIG. 2B.

In this case, an auto-zero signal $V_{OZ}$ may have a logic high value during an auto-zero operation for removing an offset of a comparator, which is included in the comparison block 120, and an operation for sampling a reset pixel signal $V_{PIX\_Reset}$.

The ramp signal $V_{RAMP}$ may have a logic high value while the comparator of the comparison block 120 receives the half ramp signal from the ramp signal generator and analog-to-digital converts a pixel signal $V_{PIX}$. While the ramp signal $V_{RAMP}$ has a logic high value, a first signal $V_{VCM}$, a second signal $V_{CK}$ and a third signal $V_{LSB}$ may have a logic high value.

The first signal $V_{VCM}$ signal may have a logic high value while a half of the entire generation range of ramp signal allocated for analog-to-digital conversion is generated and applied to the comparator of the comparison block 120.

The second signal $V_{CK}$ may have a logic high value while a comparison result value of the comparator of the comparison block 120 is sensed and stored. Depending on an output result of the comparator of the comparison block 120, the ramping direction detector 130 may apply a $V_{UP}$ or $V_{DN}$ signal to the ramp signal selector 110. If the ramp signal VRAMP, which has a constant voltage level before ramping, is greater than the pixel signal VPIX, the comparison result signal VOUT may have a logic high value. If the ramp signal VRAMP, which has a constant voltage level before ramping, is lower than the pixel signal VPIX, the comparison result signal VOUT may have low value. When the voltage level of the ramp signal VRAMP becomes lower than the voltage level of the pixel signal VPIX in a state where the comparison result signal VOUT have a logic high value by downward ramping of the ramp signal VRAMP, the ramping direction detection result VDN is activated to adjust a swing direction of the outputted comparison result signal VOUT. When the voltage level of the ramp signal VRAMP becomes greater than the voltage level of the pixel signal VPIX in a state where the output voltage VOUT have a logic low value by upward ramping of the ramp signal VRAMP, the ramping direction detection result VUP is activated to adjust a swing direction of the outputted comparison result signal VOUT.

The third signal $V_{LSB}$ may have a logic high value while the ramp signal generator generates a half ramp signal that goes down or rises by one step and apply the half ramp signal to the comparator of the comparison block 120.

Next, referring to FIGS. 2A and 2B, an analog-to-digital conversion operation when the pixel signal $V_{PIX}$ is the reset pixel signal $V_{PIX\_Reset}$ will be described as follows.

First, when a switch $SW_{OZ}$ is switched on, first and second input voltages $V_{IN1}$ and $V_{IN2}$ of the comparator may have the same value through differential feedback. In this case, an offset value of the comparator may be sampled in capacitors $C_1$ and $C_2$. Simultaneously, a reset pixel signal value $V_{PIX\_Reset}$ and a specific fixed value (i.e., a common voltage value of the half ramp signal) of the half ramp signal (i.e., the rising or falling half ramp signal inputted at the initial stage) may be sampled in the capacitors $C_1$ and $C_2$, respectively. That is, the capacitor $C_1$ may sample the reset pixel signal value $V_{PIX\_Reset}$ based on the first input voltage value VIN (i.e., an offset value of the comparator), and the capacitor $C_2$ may sample the common voltage value of the half ramp signal based on the second input voltage $V_{IN2}$ (i.e., an offset value of the comparator).

Then, as the switch $SW_{OZ}$ is switched off and the half ramp signal is applied through the capacitor $C_2$, the half ramp signal may be transferred like an AC voltage to the node of the second input voltage $V_{IN2}$. Based on such a principle, a counter (not illustrated) may perform counting from a point of time that the half ramp signal rises or falls to a point of time that the comparison result signal is outputted as the first and second input voltages $V_{IN1}$ and $V_{IN2}$ cross each other, and output the counting value as a digital code, such that the digital code is utilized as an analog-to-digital converted value of the reset pixel signal $V_{PIX\_Reset}$.

In the operation of a conventional comparator, ramping of a ramp signal is typically sequentially performed from 1 to 1024 LSB, based on 10 bits.

Figure 3A:
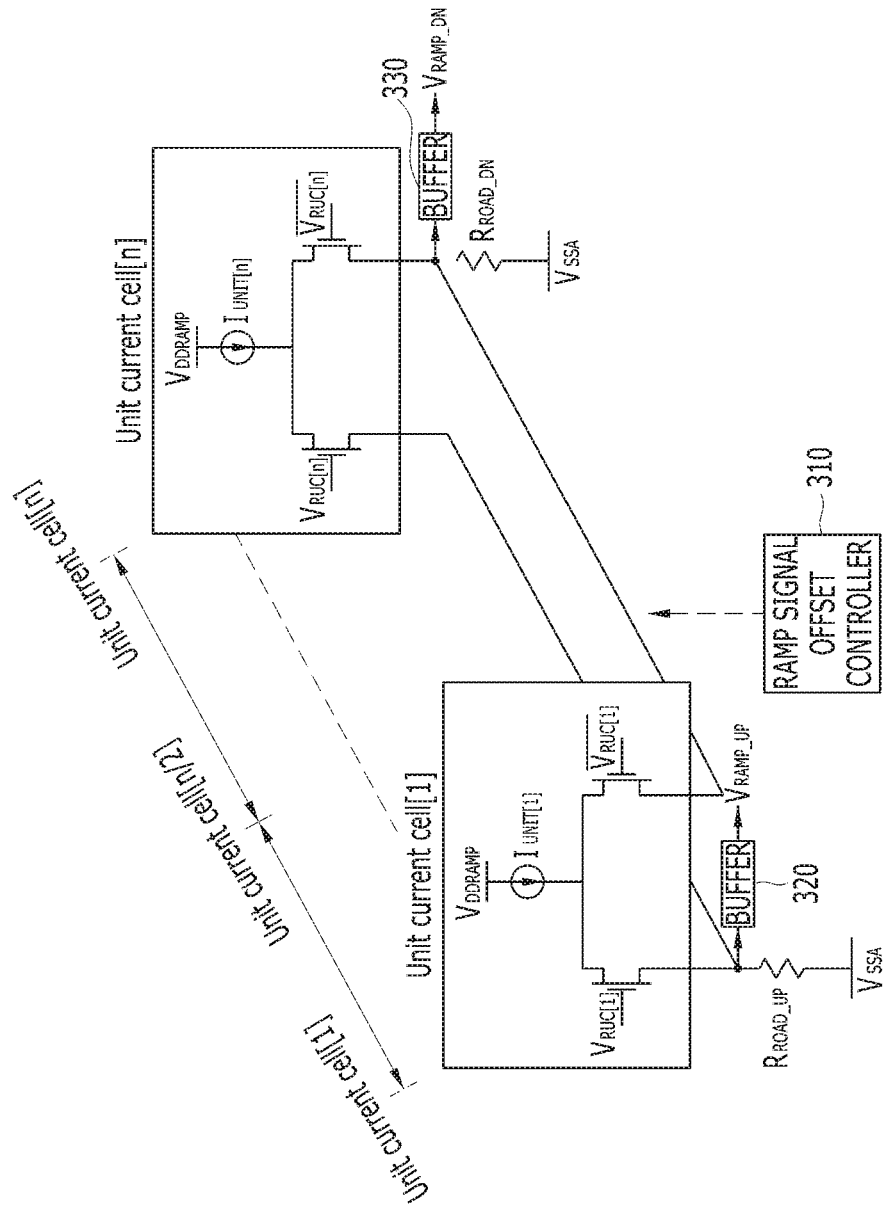
FIG. 3A is an exemplary configuration diagram of a ramp signal generator in accordance with an embodiment of the present invention.
Figure 3B:
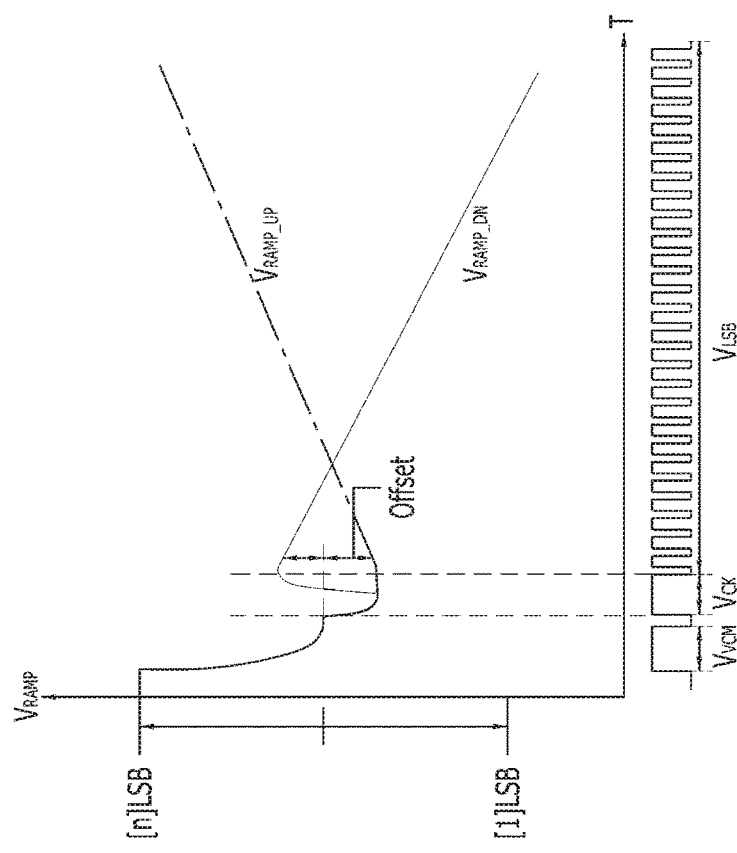
FIGS. 3B and 3C illustrate waveforms of half ramp signals.
Figure 3C:
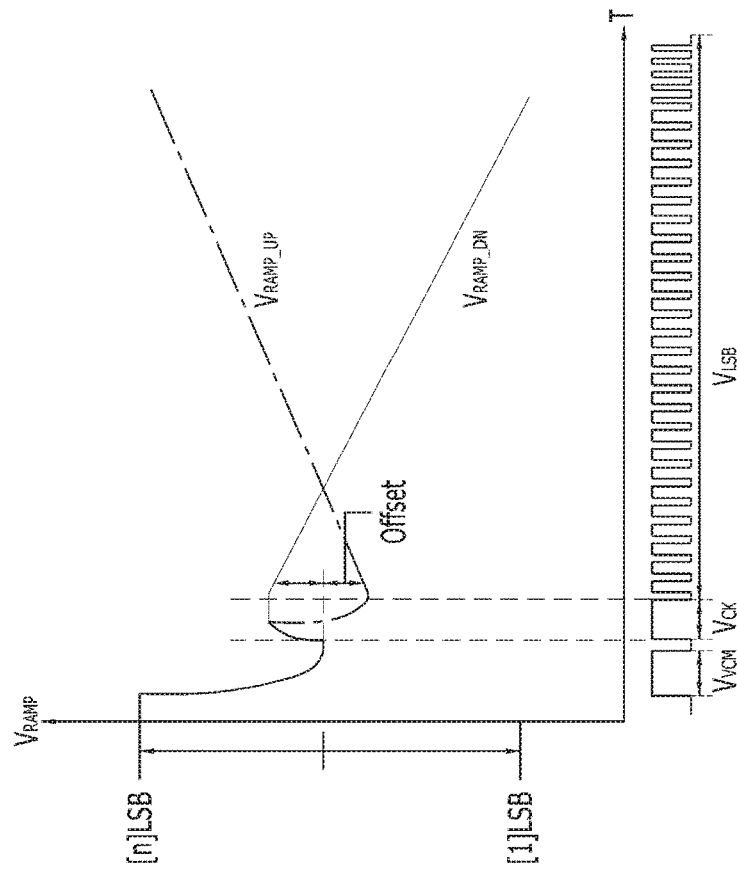

In the case of the operation of the comparator in accordance with the present embodiment, however, when the half ramp signal swings to a half value (for example, n/2 LSB) of the entire ramping code n as illustrated in FIGS. 3B and 3C such that an AC-like change is transferred to the node of the second input voltage $V_{IN2}$ through the capacitor $C_2$, the initial comparison result signal having a value of 0 or may be outputted according to a comparison result of the comparator, and the initial bit may be decided by the data converter 140.

Using the initial comparison result signal, it is possible to check whether the reset pixel signal value $V_{PIX\_Reset}$ of the first input voltage $V_{IN1}$ is positioned at the upper or lower range based on the half of the entire range of the ramp signal. That is, when the initial comparison result signal is outputted from the comparator (for example, the final comparator when provided with a plurality of comparators), the ramping direction detector 130 may detect the ramping direction using the initial comparison result signal.

According to the ramping direction detection result $V_{UP}$ or $V_{DN}$ from the ramping direction detector 130, the ramp signal selector 110 may select a rising ramp signal or falling ramp signal. Furthermore, according to the ramping direction detection result of the ramping direction detector 130, the swapping form of a comparator output may be decided by a swap block (refer to FIGS. 4A and 4B below). Then, as indicated by the third signal $V_{LSB}$ of FIGS. 3B and 3C illustrating output waveforms of the half ramp signal, the half ramp signal may be ramped in the same manner as the existing ramp signal.

The ramping direction decision will be described in more detail as follows.

In general, when the half ramp signal is ramped to n/2 LSB due to a unique offset of the comparator or a comparator delay which occurs because the comparator has a finite gain, or when the first input voltage $V_{IN1}$ is compared to the second input voltage $V_{IN2}$ (=n/2 LSB), "$V_{IN1}$+comparator offset and delay" may be compared to the second input voltage $V_{IN2}$ (=n/2 LSB) in reality. In this case, since it becomes difficult to accurately set a direction for upward ramping or downward ramping, an error code may occur around n/2 LSB.

In order to solve such a problem, an operation of checking an upward or downward direction may be performed while the second signal $V_{CK}$ has a logic high value after the half ramp signal is ramped to n/2 LSB.

That is, the upward or downward direction may be checked at (n/2 LSB-OFFSET LSB) or (n/2 LSB+OFFSET LSB), and the upward or downward ramping direction may be decided.

That is, when $V_{IN1}$−(n/2 LSB-OFFSET LSB)>0 as illustrated in FIG. 3B, the upward ramping direction may be decided to select the rising half ramp signal $V_{RAMP\_UP}$, and when $V_{IN1}$−(n/2 LSB-OFFSET LSB)<0, the downward ramping direction may be decided to select the falling half ramp signal $V_{RAMP\_DN}$.

Alternatively, when $V_{IN1}$−(n/2 LSB+OFFSET LSB)>0 as illustrated in FIG. 3C, the upward ramping direction may be decided to select the rising half ramp signal $V_{RAMP\_UP}$, and when $V_{IN1}$−(n/2 LSB+OFFSET LSB)<0, the downward ramping direction may be decided to select the falling half ramp signal $V_{RAMP\_DN}$.

As described above, the ADC in accordance with the present embodiment can decide one bit in advance through the initial comparison process between the half ramp signal and the pixel signal, and reduce the ramping clocks corresponding in half, thereby acquiring the effects of a low-power and high-speed operation.

After the analog-to-digital conversion operation is completed in the case where the pixel signal $V_{PIX}$ is the reset pixel signal $V_{PIX\_Reset}$, the half ramp signal (i.e., the selected rising or falling half ramp signal) may be reset to a specific fixed value (that is, the common voltage value of the half ramp signal), and then applied and sampled in the capacitor $C_2$. When a stable pixel signal $V_{PIX\_Signal}$ of the pixel signal $V_{PIX}$ is applied and sampled in the capacitor $C_1$, the CDS value of the pixel signal $V_{PIX}$ may be applied to the node of the first input voltage $V_{IN1}$ of the comparator. Then, the ADC may perform the same operation process as the analog-to-digital conversion operation of the reset pixel signal $V_{PIX\_Reset}$, thereby acquiring the effects of a low-voltage and high-speed operation.

FIG. 3A is an exemplary configuration diagram of the ramp signal generator in accordance with an embodiment of the present invention, and FIGS. 3B and 3C illustrate exemplary waveforms of the half ramp signals.

A conventional ramp signal generator generates a ramp-shaped reference voltage or a ramp signal, using unit current cells. The unit current cells have a differential structure, and the conventional ramp signal generator may generate differential ramp signals using the differential structure of the unit current cells. For example, the conventional ramp signal generator generates a ramp signal from one step to 1024 steps each time, based on 10-bit resolution, and the comparator of the comparison block 120 compares the ramp signal VRAMP to the pixel signal $V_{PIX}$, and outputs a comparison result signal such that analog-to-digital conversion is performed.

In the present embodiment, however, the ramp signal generator may generate the half ramp signal $V_{PIX\_UP}$ or $V_{PIX\_DN}$ which swings at the central step and rises or falls. Then, the comparator may initially compare the pixel signal $V_{PIX}$ in half ramp signal $V_{PIX\_UP}$ or $V_{PIX\_DN}$ at n/2+k or n/2−k, and output the initial comparison result signal, where k represents a ramp signal offset value which is a natural number smaller than n/2. Thus, the ramping direction detector 130 may detect the ramping direction.

For this operation, as illustrated in FIG. 3A, the ramp signal generator in accordance with the present embodiment may include a rising half ramp signal generation block for generating the rising half ramp signal $V_{PIX\_UP}$ and a falling half ramp signal generation block for generating the falling half ramp signal $V_{PIX\_DN}$.

The ramp signal generator may further include a ramp signal offset controller 310 for controlling offsets of the rising and falling half ramp signals $V_{PIX\_UP}$ and $V_{PIX\_DN}$ generated through the rising and falling half ramp signal generation blocks.

In this case, the ramp signal offset controller 310 may adjust the offset sizes of the rising and falling half ramp signals $V_{PIX\_UP}$ and $V_{PIX\_DN}$. The offset sizes of the rising and falling half ramp signals $V_{PIX\_UP}$ and $V_{PIX\_DN}$ may include k steps. When the offset sizes of the rising and falling half ramp signals $V_{PIX\_UP}$ and $V_{PIX\_DN}$ are adjusted, the counting size of the counter may also be adjusted.

The ramp signal generator may adjust the offset sizes of the rising and falling half ramp signals $V_{PIX\_UP}$ and $V_{PIX\_DN}$ using the ramp signal offset controller 310 as described above or adjust the offset sizes of the rising and falling half ramp signals $V_{PIX\_UP}$ and $V_{PIX\_DN}$ by controlling the on/off order of the unit current cells according to a control signal from an image signal processor (ISP).

The ramp signal generator may further include a buffer 320 for buffering the rising half ramp signal $V_{PIX\_UP}$ generated through the rising half ramp signal generation block and a buffer 330 for buffering the falling half ramp signal $V_{PIX\_DN}$ generated through the falling half ramp signal generation block. The ramp signal generator can prevent its performance reduction through the buffers.

As illustrated in FIGS. 3B and 3C, the rising half ramp signal generation block may generate the rising half ramp signal $V_{PIX\_UP}$, which swings at the half value of the entire ramping code n from the common voltage value and upward ramps after the ramp signal offset value is reflected.

Furthermore, as illustrated in FIGS. 3B and 3C, the falling half ramp signal generation block may generate the falling half ramp signal $V_{PIX\_DN}$, which swings in half value of the entire ramping code n from the common voltage value and downward ramps after the ramp signal offset value is reflected.

In this case, the rising half ramp signal generation block may be implemented with a half of the whole unit current cells of the ramp signal generator, and the falling half ramp signal generation block may be implemented with the other half of the whole unit current cells of the ramp signal generator.

Figure 4A:
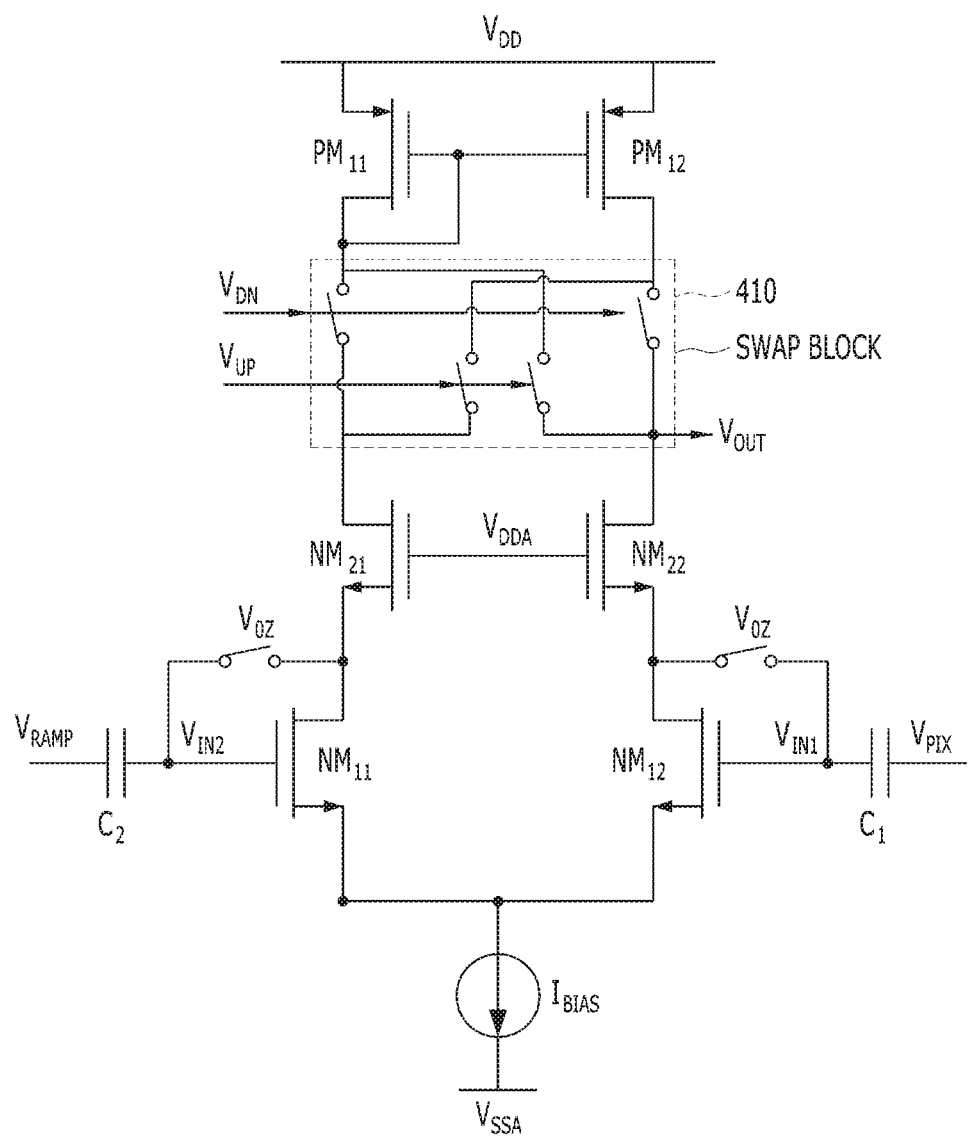
FIGS. 4A and 4B are exemplary configuration diagrams of a comparator in accordance with an embodiment of the present invention.
Figure 4B:
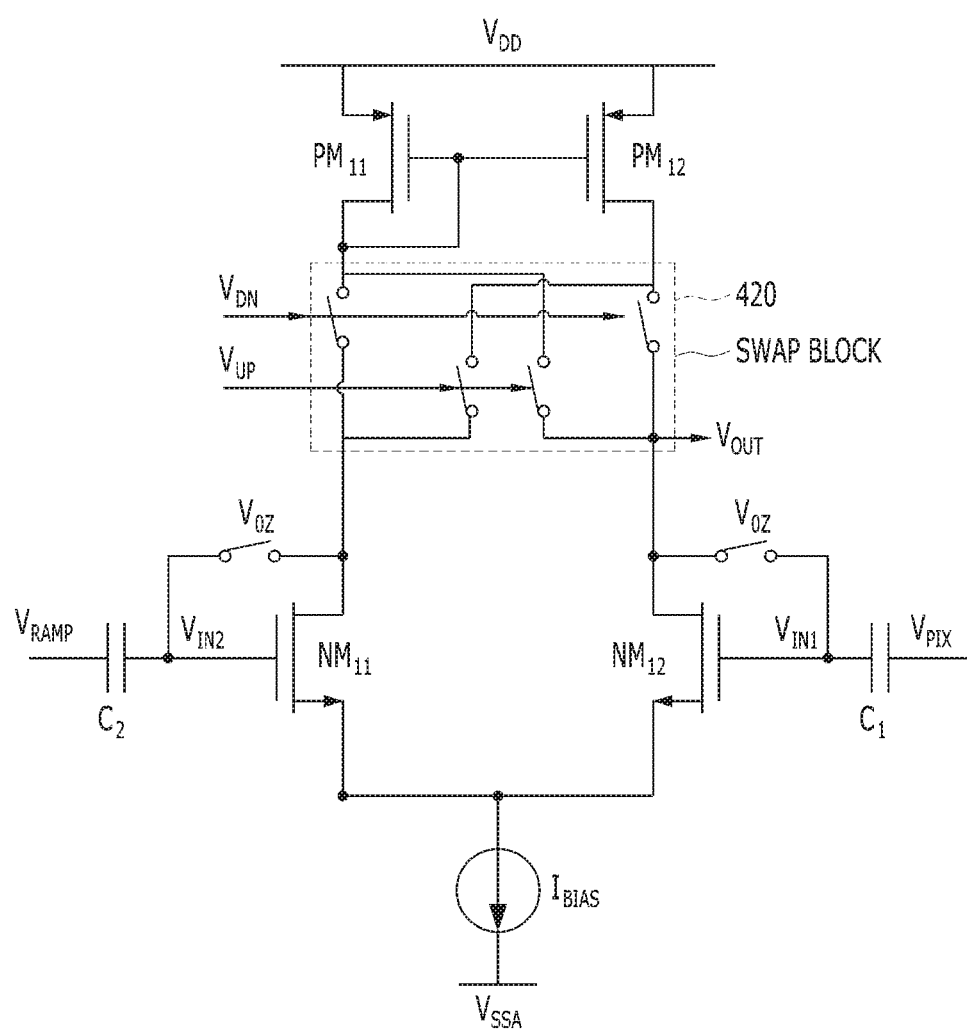

FIGS. 4A and 4B are exemplary configuration diagrams illustrating the comparator of the comparison block 120 in accordance with an embodiment of the present invention.

In general, the output swing direction of the comparator may be changed depending on the direction of an input ramp signal. Thus, banding noise may occur due to a delay of the comparator or a change of a parasitic capacitor value between the gate and source of an input transistor of the comparator, which is seen from the ramp signal generator.

In order to solve such a problem, the comparator may swap an output node of an output terminal thereof according to the direction of the ramp signal, in order to constantly maintain the output swing direction. That is, as illustrated in FIG. 4A or 4B, the comparator may switch switches of swap block 410 or 420 according to the ramping direction detection result $V_{UP}$ or $V_{DN}$ from the ramping direction detector 130, in order to constantly adjust the output characteristic (i.e., output swing direction) of the output voltage $V_{OUT}$.

For this operation, the comparator in accordance with an embodiment may further include the swap block 410 or 420 which is installed at the output terminal thereof and adjusts the swing direction of the comparison result signal according to the ramping direction detection result from the ramping direction detector 130. At this time, the function of the swap blocks 410 and 420 may be implemented with a plurality of switches and may be applied to other similar comparators other than the comparators illustrated in FIGS. 4A and 4B. Since the components of the comparator excluding the swap blocks 410 and 420 are publicly known, the detailed descriptions thereof are omitted herein.

Figure 5:
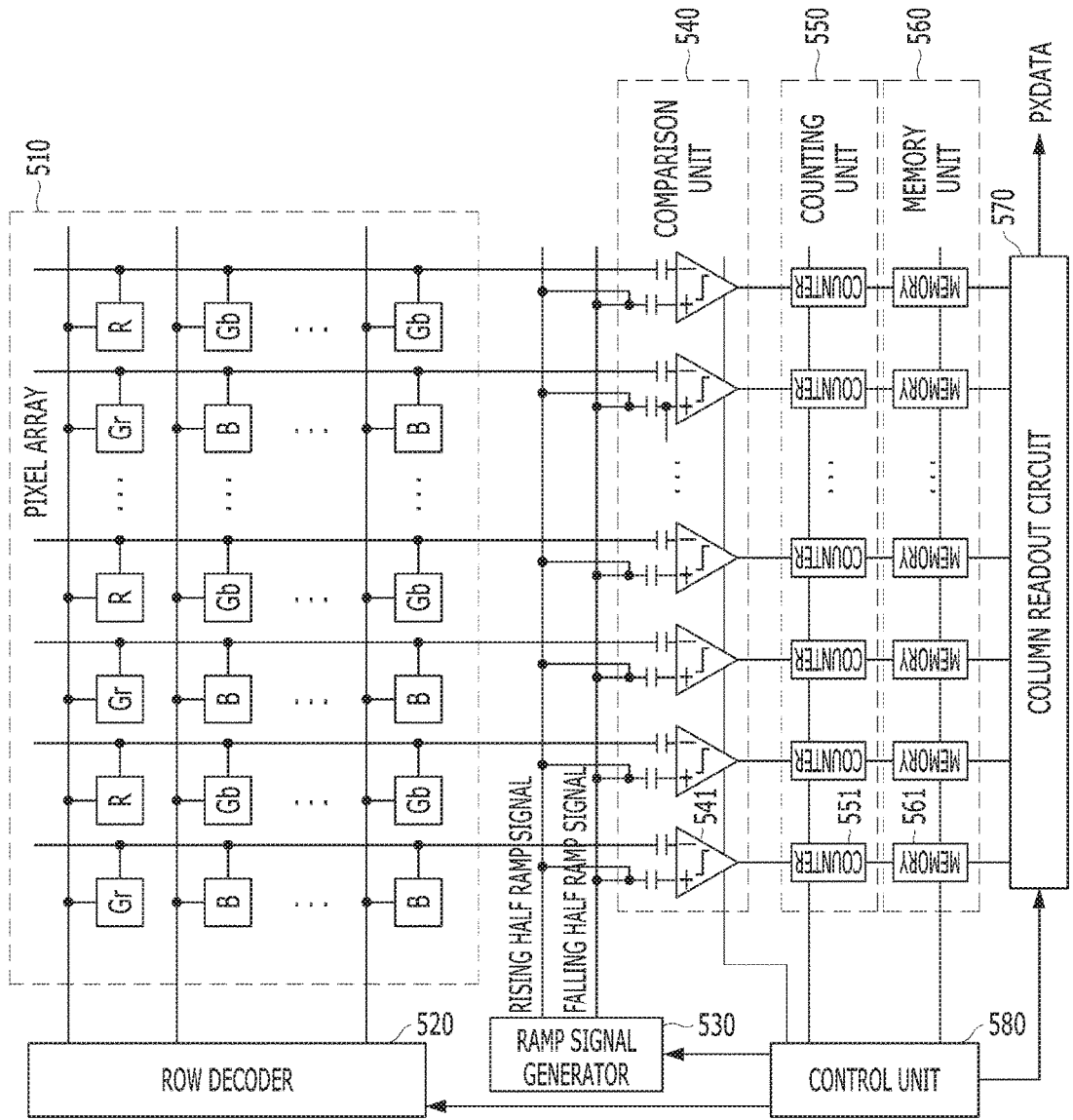
FIG. 5 is an exemplary configuration diagram of a CIS in accordance with an embodiment of the present invention.

FIG. 5 is an exemplary configuration diagram of a CIS in accordance with an embodiment of the present invention.

As illustrated in FIG. 5, the CIS may include a pixel array 510, a row decoder 520, a ramp signal generator 530, a comparison unit 540, a counting unit 550, a memory unit 560, a control unit 580 and a column readout circuit 570.

The pixel array 510 may output a pixel signal corresponding to corresponding to incident light.

The row decoder 520 may select a pixel in the pixel array 510 at each row line, and control an operation of the selected pixel, according to control of the control unit 580.

The ramp signal generator 530 may generate rising and falling half ramp signals $V_{PIX\_UP}$ and $V_{PIX\_DN}$ according to control of the control unit 580.

The comparison unit 540 may compare the value of the rising or falling ramp signal $V_{PIX\_UP}$ or $V_{PIX\_DN}$ applied from the ramp signal generator 530 to the values of pixel signals outputted from the pixel array 510, according to control of the control unit 580.

The counting unit 550 may decide the initial bit and count a clock applied from the control unit 580, according to output signals of the comparison unit 540.

The memory unit 560 may store the counting information from the counting unit 550 according to control of the control unit 580.

The column readout circuit 570 may sequentially output the data of the memory unit 560 as pixel data PXDATA according to control of the control unit 580.

The control unit 580 may control the operations of the row decoder 520, the ramp signal generator 530, the comparison unit 540, the counting unit 550, the memory unit 560 and the column readout circuit 570.

The comparison unit 540 may be implemented with the ramp signal selector 110, the comparison block 120 and the ramping direction detector 130 of FIG. 2A, and the counting unit 550 and the memory unit 560 may be implemented with the data converter 140 of FIG. 2A. Furthermore, the ramp signal generator 530 may be implemented as described above with reference to FIG. 3A.

In accordance with the described embodiments, the ADC can select one bit in advance through the initial comparison process between the half ramp signal and the pixel signal, select the rising or falling half ramp signal, compare the selected signal to the pixel signal, and perform analog-to-digital conversion according to the comparison result, thereby reducing power consumption while digitally converting analog data at high speed.

Although various embodiments have been described for illustrative purposes, it will be apparent to those skilled in the art that various changes and modifications may be made without departing from the spirit and scope of the invention as defined in the following claims.

What is claimed is:

1. An analog-to-digital converter (ADC) comprising:
   a ramp signal selector suitable for selecting a rising half ramp signal or falling half ramp signal according to a ramping direction detection result from a ramping direction detector;
   a comparator suitable for outputting an initial comparison result signal by initially comparing a half ramp signal and a pixel signal, and outputting a comparison result signal by comparing the rising or falling half ramp signal selected through the ramp signal selector to the pixel signal;
   the ramping direction detector suitable for detecting a ramping direction according to the initial comparison result signal from the comparator; and
   a data converter suitable for deciding an initial bit according to the initial comparison result signal from the comparator, and performing data conversion according to the comparison result signal from the comparator,
   wherein the comparator comprises an initial comparator, and
   the initial comparator comprises a swap block installed at an output terminal thereof, and suitable for adjusting a swing direction of the outputted comparison result signal according to the ramping direction detection result from the ramping direction detector.

2. The ADC of claim 1, wherein the ramp signal selector comprises:
   a first switch suitable for turning on or off the rising half ramp signal applied to the comparator according to the ramping direction detection result from the ramping direction detector; and a second switch suitable for turning on or off the falling half ramp signal applied to the comparator according to the ramping direction detection result from the ramping direction detector.

3. The ADC of claim 1, further comprising a ramp signal generator suitable for generating the rising and falling half ramp signals,
wherein the ramp signal generator comprises:
a rising half ramp signal generator suitable for generating the rising half ramp signal; and
a falling half ramp signal generator suitable for generating the falling half ramp signal.

4. The ADC of claim 3, wherein the ramp signal generator further comprises a ramp signal offset controller suitable for controlling offsets of the rising and falling half ramp signals generated through the rising and falling half ramp signal generators.

5. The ADC of claim 3, wherein the ramp signal generator adjusts offset sizes of the rising and falling half ramp signals by controlling an on/off order of unit current cells according to a control signal from an image signal processor (ISP).

6. The ADC of claim 3, wherein the ramp signal generator further comprises:
a first buffer suitable for buffering the rising half ramp signal generated through the rising half ramp signal generator; and
a second buffer suitable for buffering the falling half ramp signal generated through the falling half ramp signal generator.

7. The ADC of claim 3, wherein the rising half ramp signal generator generates the rising half ramp signal that swings to a half value of an entire ramping code from a common voltage value, and upward ramps after a ramp signal offset value is reflected.

8. The ADC of claim 3, wherein the falling half ramp signal generator generates the falling half ramp signal that swings to a half value of an entire ramping code from a common voltage value, and downward ramps after a ramp signal offset value is reflected.

9. A complementary metal oxide semiconductor (CMOS) image sensor (CIS) comprising:
a pixel array suitable for outputting a pixel signal corresponding to incident light;
a row decoder suitable for selecting and controlling a pixel in the pixel array at each row line of the pixel array;
a ramp signal generator suitable for generating rising and falling half ramp signals;
a ramp signal selector suitable for selecting the rising half ramp signal or the falling half ramp signal from the ramp signal generator according to a ramping direction detection result from a ramping direction detector;
a comparator suitable for outputting an initial comparison result signal by initially comparing a half ramp signal and the pixel signal, and outputting a comparison result signal by comparing the rising half ramp signal or the falling half ramp signal selected through the ramp signal selector to the pixel signal;
the ramping direction detector suitable for detecting a ramping direction according to the initial comparison result signal from the comparator;
a data converter suitable for deciding an initial bit according to the initial comparison result signal from the comparator, and performing data conversion according to the comparison result signal from the comparator;
a controller suitable for controlling the operations of the row decoder, the ramp signal generator, the comparator, the data converter and a column readout circuit; and
the column readout circuit suitable for outputting data of a memory unit according to control of the controller,
wherein the comparator comprises an initial comparator, and
the initial comparator comprises a swap block installed at an output terminal thereof, and suitable for adjusting a swing direction of the outputted comparison result signal according to the ramping direction detection result from the ramping direction detector.

10. The CIS of claim 9, wherein the ramp signal selector comprises:
a first switch suitable for turning on or off the rising half ramp signal applied to the comparator according to the ramping direction detection result from the ramping direction detector; and
a second switch suitable for turning on or off the falling half ramp signal applied to the comparator according to the ramping direction detection result from the ramping direction detector.

11. The CIS of claim 9, wherein the ramp signal generator further comprises:
a rising half ramp signal generator suitable for generating the rising half ramp signal; and
a falling half ramp signal generator suitable for generating the falling half ramp signal.

12. The CIS of claim 11, wherein the ramp signal generator further comprises a ramp signal offset controller suitable for controlling offsets of the rising and falling half ramp signals generated through the rising and falling half ramp signal generators.

13. The CIS of claim 11, wherein the ramp signal generator adjusts offset sizes of the rising and falling half ramp signals by controlling an on/off order of unit current cells according to a control signal from an image signal processor (ISP).

14. The CIS of claim 11, wherein the ramp signal generator further comprises:
a first buffer suitable for buffering the rising half ramp signal generated through the rising half ramp signal generator; and
a second buffer suitable for buffering the falling half ramp signal generated through the falling half ramp signal generator.

15. The CIS of claim 11, wherein the rising half ramp signal generator generates the rising half ramp signal that swings to a half value of an entire ramping code from a common voltage value, and upward ramps after a ramp signal offset value is reflected.

16. The CIS of claim 11, wherein the falling half ramp signal generator generates the falling half ramp signal that swings to a half value of an entire ramping code from a common voltage value, and downward ramps after a ramp signal offset value is reflected.

* * * * *